United States Patent [19]

Trong et al.

[11] Patent Number: 4,539,501
[45] Date of Patent: Sep. 3, 1985

[54] EPITAXIAL STRUCTURE WITH INCREASED PIEZOELECTRIC EFFECT AND A SURFACE ACOUSTIC WAVE ELECTRONIC DEVICE COMPRISING SUCH A STRUCTURE

[75] Inventors: Linh N. Trong, Bourg La Reine; Jean Chevrier, Gif-Sur-Yvette, both of France

[73] Assignee: Thompson-CSF, Paris, France

[21] Appl. No.: 563,251

[22] Filed: Dec. 19, 1983

[30] Foreign Application Priority Data

Dec. 30, 1982 [FR] France ................................ 82 22065

[51] Int. Cl.$^3$ ............................................ H01L 41/08
[52] U.S. Cl. .................................. 310/313 A; 310/328; 310/334; 310/311; 333/147; 333/187; 333/193
[58] Field of Search .................. 310/311, 313 A, 334, 310/328; 333/141, 147, 187, 190, 191, 193; 357/26, 16, 4; 148/175

[56] References Cited

U.S. PATENT DOCUMENTS

| | | | |
|---|---|---|---|
| 3,351,786 | 11/1967 | Muller et al. | 310/311 X |
| 3,726,585 | 4/1973 | Fedotowsky et al. | 350/356 |
| 4,456,850 | 6/1984 | Inoue et al. | 310/328 X |
| 4,469,977 | 9/1984 | Quinn et al. | 310/334 |

OTHER PUBLICATIONS

IBM Technical Disclosure Bulletin, vol. 15, No. 3, (Aug. 72), V. L. Rideout, "Fabrication of Multilayer Thin-Film Piezoelectric Transducers," pp. 928–929.
Electronics Letters, vol. 17, No. 12, (Jun. 81), J. Henaff et al., "New SSBW Mode in GaAs," pp. 427–428.
Japanese Journal Applied Physics, Supplement 16-1, vol. 1, (1977), K. W. Yeh et al., "Detection of Acoustic Waves with a PI-DMOS Transducer," pp. 517–521.

*Primary Examiner*—Mark O. Budd
*Attorney, Agent, or Firm*—Oblon, Fisher, Spivak, McClelland & Maier

[57] ABSTRACT

An epitaxial structure in which a constraint imposed by forced epitaxy causes an increase in the piezoelectric effect of a group of layers. The structure which provides this effect utilizes a semi-insulating substrate made from a first material on which is deposited by forced epitaxy a layer of a second material, the two materials are in crystalline mesh parameter disharmony, which creates in said layer a constraint increasing its piezoelectricity. On the constrained layer are deposited two groups of alternated "deforming" and "deformed" layers of the two materials. The thickness of the structure is sufficient to allow propagation of the surface waves. The advantage of this structure is that it allows two transducers such as transistors to be integrated on or at the side of this structure.

10 Claims, 6 Drawing Figures

FIG_1
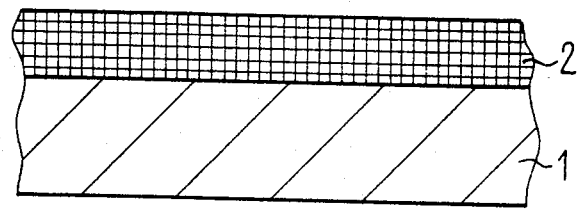
FIG_2
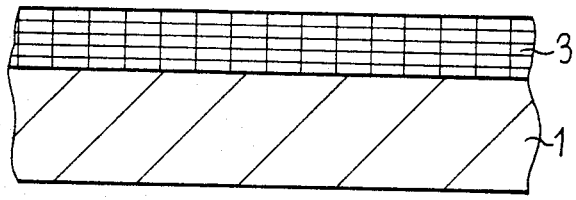
FIG_3
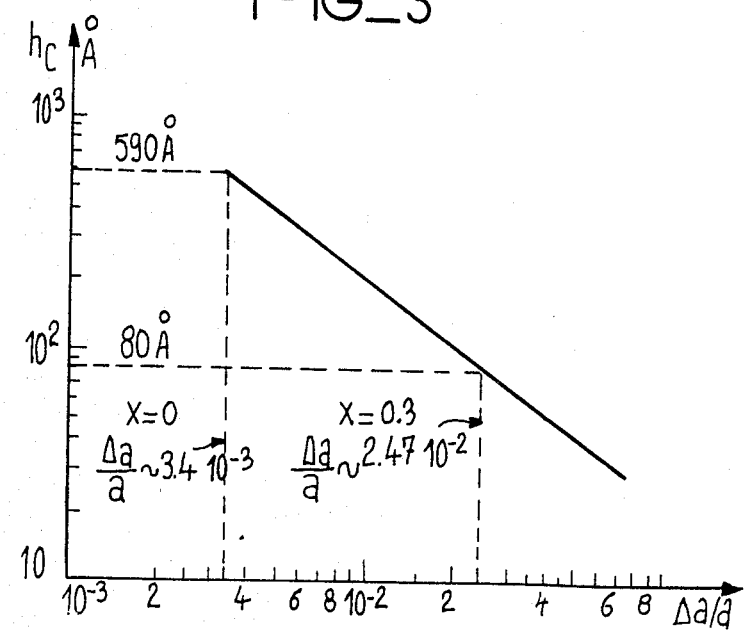

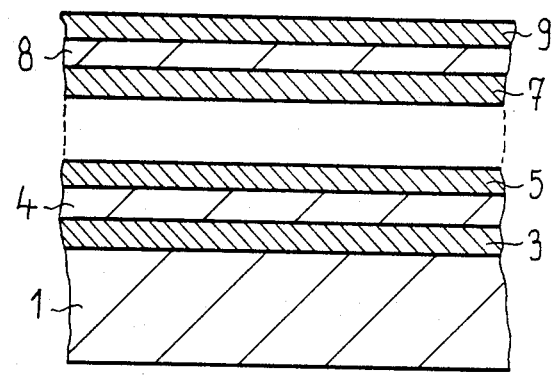
FIG_4
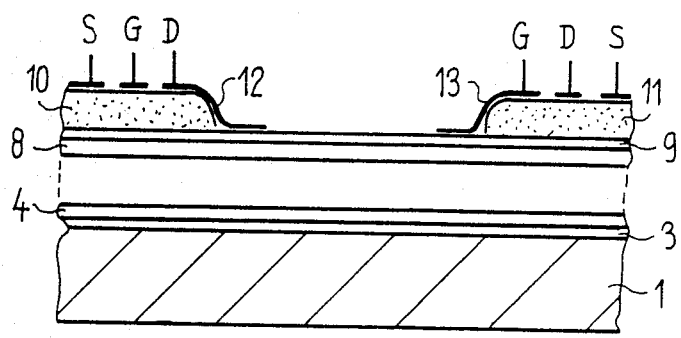
FIG_5
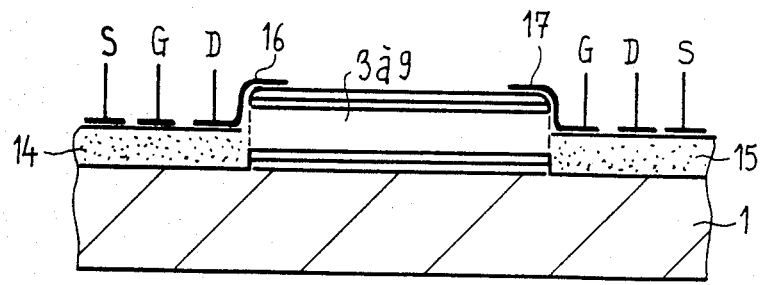
FIG_6

EPITAXIAL STRUCTURE WITH INCREASED PIEZOELECTRIC EFFECT AND A SURFACE ACOUSTIC WAVE ELECTRONIC DEVICE COMPRISING SUCH A STRUCTURE

BACKGROUND OF THE INVENTION

1. Field of the Invention

The present invention relates to an epitaxial structure with increased piezoelectric effect, offering the possibility of integrating in the same semi-conductor material crystal one or more piezoelectric components and electronic components. The invention relates to the field of surface acoustic waves.

2. Description of the Prior Art

Surface acoustic waves are widely used in microelectronics for constructing delay lines, filters adapted to coded signals or convoluters for example.

In general, an electronic system of this type is formed of two separate parts, one providing the acoustic function, the other the signal processing electronic function, each of the two parts being formed from a different material from the other part.

Elastic waves may treat electric signals in a frequency range extending from a few megahertz to several gigahertz, and the use of Rayleigh wave filters has provided a neat solution to the problem of filtering modern radar signals for example. But the structure of these filters is only simple if the substrate is piezoelectric. This requirement in practice restricts the number of useable materials: for example quartz ($SiO_2$), lithium niobate ($LiNbO_3$) and lithium tantalate ($LiTaO_3$). To widen the choice of possible materials and functions obtainable, researches have been undertaken for depositing piezoelectric layers, for example aluminum nitrite (AlN) or zinc oxide (ZnO) on different substrates such as glass or alumina. Structures of the "ZnO layer on silicon substrate" kind allow hybrid integration.

For obvious reasons—the more thorough the integration the better the reliability—it is advantageous to integrate the acoustical electronic functions on a single substrate, a monolithic semi-conductor crystal allowing both functions to be provided at one and the same time. However, most of the materials known as semi-conductor materials, Si, GaAs, InP . . . etc, are not piezoelectric (Si) or only very slightly (Ga As, InP . . . ).

According to the invention, the piezoelectric effect of a material suitable for constructing a semi-conductor component but only slightly piezoelectric is increased by distorting its crystalline network, so as to increase the disymmetry thereof which is productive of the piezoelectric effect. The piezoelectricity of the material is thus increased, since it is forced by the desired distortion of its crystallographic network, which distortion is obtained by the disharmony of the crystalline mesh parameters between the substrate and the layer in which it is desired to provide the piezoelectric effect.

But, since the piezoelectric effect increased by the constraint is exerted over a small thickness, which will be discussed further on, and which does not exceed 200 Å on average, and since on the other hand the surface waves move over a depth of the order of several thousand angstroms, the structures of the invention are formed by a plurality of layers of the increased piezoelectric effect material, alternating with a plurality of layers of the material of the substrate, or of the material having the same crystalline parameter, each interface between two successive layers, out of harmony in the mesh parameter, distorting the crystalline network of the piezoelectric layer.

SUMMARY OF THE INVENTION

More precisely, the invention relates to an epitaxial structure with piezoelectric effect having, supported by a semi-insulating substrate, a plurality of epitaxied layers, wherein the epitaxied layers form two groups of layers, formed from two regularly alternating materials, the first material of the first group of layers having a crystalline mesh parameter equal to that of the substrate, the second material of the second group of layers having a crystalline mesh parameter different from that of the substrate and being more piezoelectric, the disharmony of the crystalline parameter between the substrate and the layers of the first group imposing on the layers of the second group a constraint deforming the crystalline network which increases the piezoelectric effect.

BRIEF DESCRIPTION OF THE DRAWINGS

The invention will be better understood from the following description of one embodiment of an increased piezoelectric effect structure, which refers to the accompanying figures which show:

FIG. 1: a schematical section of two crystalline networks, with crystalline meshes in harmony:

FIG. 2: a schematical section of two crystalline networks, with mesh parameter mismatching, FIG. 3: a graph giving the thickness of the epitaxy layer under constraint, as a function of the mismatching of the networks, FIG. 4: a schematical section of a piezoelectric effect multi-layer structure, FIG. 5: section of an integrated monolithic structure with a surface acoustic waves and signal processing electronics, and FIG. 6: a variation of the preceding structure.

DESCRIPTION OF THE PREFERRED EMBODIMENT

FIGS. 1 and 2 show how the piezoelectric effect of the material may be increased, which means that the crystalline network of the material originally very little piezoelectric is deformed. The increase in the piezoelectric effect obtained results from the relative movement of the electric charges in the crystalline network and so of the formation of dipoles.

In these Figures, the crystalline network of the epitaxied layer is, by convention, represented by a network of straight lines defining squares when the crystal is not deformed and a rectangle if the crystal is deformed. This schematic representation does not imply that the crystalline system is necessarily of the cubic type and that the epitaxial relationship occurs along a given crystallographic axis. In fact, the following considerations are absolutely general and apply to any epitaxial system. On the other hand, so as to give more precision to the description of the invention, this latter will be described with reference to one embodiment of an electronic circuit comprising a surface wave device on the same substrate of the GaAs type, or more generally, of the families III-V, II-VI, IV-VI.

FIG. 1 shows, deposited by epitaxy on a substrate 1, a layer 2 in perfect epitaxial harmony with its substrate, that is to say that the mesh parameters are such that the crystalline network of layer 2 corresponds perfectly with the mesh parameters of substrate 1. Such system exist for example:

$Ga_xIn_{1-x}As_yP_{1-y}$ and InP, or $Al_xGa_{1-x}As_yP_{1-y}$ and GaAs.

FIG. 2 shows the case where an epitaxial layer 3 is in forced epitaxial relationship with substrate 1: layer 3 is formed by a material with a crystalline parameter different from that of the substrate. The epitaxy takes place by plastic deformation of the crystalline network of the epitaxial layer 3. It is assumed here that the epitaxial layer is much thinner than the substrate, consequently its plastic deformation is much greater. The case shown in FIG. 2 corresponds to stretching of the crystalline network of layer 3, its crystalline parameter ($a_3$) being smaller than that ($a_1$) of the substrate. In the case where the crystalline parameter ($a_3$) of the epitaxied layer is greater than the crystalline parameter ($a_1$) of the substrate, the epitaxied layer is under compression, but the effect of deformation of the crystalline network remains comparable.

If mismatching of the crystalline networks is too great for the constraints to be entirely absorbed by the elasticity of the material, mismatching dislocations of the network appear (DAR), and the constraint is relaxed. The dislocation density depends on the parameter of the crystalline disharmony $\Delta a_3 = a_3 - a_1$ and on the mechanical properties of the material.

In general, an epitaxial layer of very fine thickness absorbs the network mismatching by elasticity, but if this thickness becomes great, the rigidity of the layer increases and may create DAR dislocations. The thickness at which the DAR dislocations occur for a given material is called critical thickness $h_c$. J. W. Matthews, A. E. Blakeslee and S. Mader (Thin solid Films, 33 (1976) 253), have shown that $h_c$ is defined by the equation:

$$h_c = \frac{b(1 - \nu\cos^2\alpha)}{8\pi \frac{\Delta a}{a}(1+\nu)\lambda} \text{Log}\left(\frac{h_c}{b}\right)$$

$\nu$ is Poissons coefficient
$\alpha$ the angle between Burger's vector b and the dislocation line which extends in the interface plane
$\lambda$ the angle between b and the direction to the interface, which is perpendicular to the line of intersection of the slip plane and the interface plane
$\Delta a/a$ the mesh parameter disharmony.

This equation may be simplified approximately as:

$$h_c = \frac{b}{2\Delta a/a}$$

FIG. 3 shows the variation of $h_c$ as a function of $\Delta a/a$, i.e. the thickness of the epitaxial layer under constraint, without dislocation, as a function of the mesh parameter disharmony, in the case of a layer 3 of $Al_{1-x}In_xAs$ on a GaAs substrate 1. It is obvious that this example does not limit the scope of the invention. Thus, for a pair of given materials, the simplified relationship allows the limit thickness to be defined which must not be exceeded for keeping the epitaxial layer under constraint. The variation of $h_c$ as a function of $\Delta a/a$ is, in the most general case, a straight line with a negative slope: it is obvious that the thickness of the layer under constraint becomes all the smaller the higher the disharmony parameter $\Delta a/a$. This latter is moreover in direct relationship with the index x in the formula $Al_xIn_{1-x}As$.

The curve of FIG. 3 shows that, in order to have considerable deformation of the crystalline mesh such as $\Delta a/a = 10^{-2}$, the epitaxied layer must be limited to thicknesses less than 200 Å. Such a thin layer is not sufficient for causing surface acoustic waves to propagate, since it is known that the depth of penetration of surface acoustic waves is of the order of several thousand angstroms, i.e. about one micron.

So as to have a thickness of several thousands of angstroms for the layers under constraint without for all that coming up against the limitation because of the critical thickness $h_c$, the invention consists in forming stacks of epitaxial layers under forced epitaxy, alternated with layers having the same crystalline parameters as the substrate. The layers under forced epitaxy have of course a thickness less than the critical thickness $h_c$, so as not to be dislocated by network mismatching. On the other hand, the layers which have the same mesh parameter as the substrate, or at least a mesh parameter different from that of the constrained epitaxial layers have a sufficient thickness so as not to be deformed by the epitaxial layers. FIG. 4 shows the schematical section of such a stack with increased piezoelectric effect.

So as to simplify the explanations, this Figure will be described by assuming that it corresponds to the pair of materials $GaAs/Al_xIn_{1-x}As$, with $x=0.3$. On the GaAs substrate 1 is first of all deposited a layer 3 of $Al_{0.3}In_{0.7}As$ of a thickness less than 80 Å, for example 50 Å, then a layer 4 of GaAs, of a thickness of the order of that of $Al_{0.3}In_{0.7}As$, then a new layer 5 of $Al_{0.3}In_{0.7}As$ of about 50 Å and so on, until the assembly of the stacks reaches a sufficient thickness for the propagation of surface acoustic waves.

The epitaxy of the layers is obtained by different known techniques, such as in a gaseous phase, by organometallic decomposition (MOCVD) or by moecular jets.

The first layer (3) deposited on the substrate is "deformed" thereby, because of the mismatching of the network. The second layer (4) deposited is a "deforming" layer: its interface with the lower layer (3) tends to deform the network of this layer already deposited and it also deforms the third layer (5) whose epitaxy will increase with a deformed crystalline network. The epitaxy of layer 5 if thus forced, and the piezoelectric effect of this same layer is increased. The structure of the invention comprises then a succession of so called "deformed" and "deforming" layers—with the sole purpose of simplification—which does not mean that these layers are not flat, the deforming layers having a mesh parameter equal to or close to that of the substrate and not participating in the piezoelectric effect, whereas the deformed layers, whose piezoelectric effect is increased, have a mesh parameter deformed by that of the substrate.

The succession of "deformed" and "deforming" layers is repeated until a sufficient thickness is obtained for the contemplated use. We will assume that layers 8 and 9 are respectively the last deforming and deformed surface layers of the structure.

The advantage of the increased piezoelectric effect structure of the invention is that it uses semi-conductor materials, whereas the known structures use materials which are not semi-conducting, in this sense that we cannot or do not know how to make for example a transistor therefrom: zinc oxide, lithium niobate and tantalate.

This advantage is used for integrating on the same substrate a device comprising a semi-conductor and a surface wave piezoelectric stack.

FIG. 5 shows such a device, according to a first embodiment.

To keep the pair of materials chosen for describing FIG. 3—and without this example being in anywise limiting—this device comprises a semi-insulating substrate 1 made from GaAs and a stack of "deformed" layers 3, 5 ... 7, 9 made from $Al_{0.3}In_{0.7}As$, under forced epitaxy, and "deforming" layers 4 ... 8 made from GaAs, these two types of layers being of course alternated. It also comprises electronic input and output functions, formed in a surface layer of nGaAs in the case chosen for the example. This layer of nGaAs is more epitaxed at the free surface of the piezoelectric effect stack, then is etched, either by chemical etching, or by ionic etching, so as to leave existing only two islets 10 and 11, at the ends of the surface wave line.

The electronic functions shown in FIG. 5 are field effect transistors, shown symbolically by the three source S, gate G and drain D electrodes, but they are purposely not shown in detail. In fact, several cases belong to the field of the invention:

transistors with metallizations on a single layer 10-11 of nGaAs, transistors of the heterojunction type, and layer 10-11 of nGaAs is completed by at least one layer forming a heterojunction, of $Al_yGa_{1-y}As$ type for example, or else they are MOSFETs and an insulating layer ($SiO_2$) isolates the gate, the transistors may also not be of the field effect type, but may be bipolar, electronic circuits more complex than a simple transistor, serving for signal amplification or processing.

Whatever the device adopted, there is at least one electrical connection 12 for the input device and an electrical connection 13 for the output device so as to provide excitation of the surface wave line and processing of the signals, and so also as to provide the electric connection between two surfaces which are not at the same level (thickness of the epitaxied layer 10-11).

FIG. 6 shows the same device integrated in a second embodiment.

What differentiates the second form from the first is the order of the operation, thus, the device of FIG. 6 is obtained by first of all epitaxying on a semi-insulating GaAs substrate 1 a layer of nGaAs. This is etched so as to leave existing only two islets 14 and 15 in which the transistors will be formed. Then the stack of "deformed" and "deforming" layers under constraint 3 to 9 is formed by epitaxy: this succession of operations also covers the two islets 14 and 15 which must be freed, at the end of the operations, so as to be able to deposit the electrode metalizations, as well as the metalizations 16 and 17 for the transistors—piezoelectric device connections.

The remarks which have been made in connection with FIG. 5 concerning the electronic devices remain entirely valid for this device configuration. They may be diodes or field effect or bipolar transistors, more or less complex, and this is why the drawing is a symbolisation thereof.

The invention has been described by referring to a pair ($GaAs—Al_{1-x}In_xAs$) of the family III-V: other materials from the same family III-V, or from families II-VI, such as CdS or CdTe, or IV-VI, such as PbTe, are also suitable for constructing integrated piezoelectric devices.

The invention finds its application in the construction of monolithic integrated circuits in which, besides the usual electronic functions—diodes, transistors, amplifiers ... etc.—there is at least one piezoelectric effect element, for forming delay lines, band filters, filters adapted to coded signals or convoluter for example.

We claim:

1. In an epitaxial structure with piezoelectric effect, comprising, supported by a semi-insulating substrate, a plurality of epitaxied layers, said epitaxied layers form two groups of layers, formed from two regularly alternated materials, the first material of the first group of layers having a crystalline mesh parameter equal to that of the substrate, the second material of the second group of layers having a crystalline mesh parameter different from that of the substrate and being more piezoelectric, the disharmony of the crystalline parameter between the substrate and the layers of the first group imposing on the layers of said second group a constraint deforming the crystalline network which increases the piezoelectric effect.

2. The epitaxial structure as claimed in claim 1, wherein the thickness of the layers under constraint of the second group is smaller than the thickness at which the crystalline network dislocations appear for a given disharmony of the mesh parameter.

3. The epitaxial structure as claimed in claim 1, wherein the thickness of the layers of said first group is at least equal to the thickness of the layers of said second group under constraint.

4. The epitaxial structure as claimed in claim 1, wherein the total thickness of the epitaxied layers is sufficient ($1\mu$) to allow propagation of the surface acoustic waves.

5. The epitaxial structure as claimed in claim 1, wherein the pair of materials used for the substrate and the layers of said first group, on the one hand, and for the layers of said second group, on the other hand, is chosen from the compounds of the family III-V (Ga, In,As,P,Sb).

6. The epitaxial structure as claimed in claim 1, wherein the pair of materials used for the substrate and the layers of said first group, on the one hand, and for the layers of said second group on the other is chosen from the compounds of the family II-VI (Cd—Te,S).

7. The epitaxial structure as claimed in claim 1, wherein the pair of materials used for the substrate and the layers of said first group, on the one hand, and for the layers of said second group on the other, is chosen from the compounds of the family IV-VI (Pb,Te).

8. The epitaxial structure as claimed in claim 1, where it further integrates on the same substrate, in monolithic fashion, at least one electronic device formed in at least one islet of semi-conductor material deposited on the free surface of the piezoelectric structure, the electronic device being in electric contact with said structure through a metalization.

9. The epitaxial structure as claimed in claim 1, wherein it further integrates on the same substrate, in monolithic fashion, at least one electronic device formed in at least one islet of semi-conductor material deposited on the free surface of the substrate at the side of the piezoelectric structure, the electronic device being in electric contact with said structure through a metalization.

10. A surface wave acoustic electronic device, comprising at least one monolithic epitaxial structure, with increased piezoelectric effect, as claimed in any one of claims 1 to 9.

* * * * *